(12) United States Patent
Dobuzinsky et al.

(10) Patent No.: US 7,358,172 B2
(45) Date of Patent: Apr. 15, 2008

(54) POLY FILLED SUBSTRATE CONTACT ON SOI STRUCTURE

(75) Inventors: David M. Dobuzinsky, New Windsor, NY (US); Byeong Y. Kim, Lagrangeville, NY (US); Effendi Leobandung, Wappingers Falls, NY (US); Munir D. Naeem, Poughkeepsie, NY (US); Brian L. Tessier, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/307,762

(22) Filed: Feb. 21, 2006

(65) Prior Publication Data

US 2007/0196963 A1 Aug. 23, 2007

(51) Int. Cl.
*H01L 21/44* (2006.01)
(52) U.S. Cl. ................ 438/597; 438/430; 257/E21.585
(58) Field of Classification Search ................ 438/597, 438/430; 257/E21.585
See application file for complete search history.

(56) References Cited

U.S. PATENT DOCUMENTS

| | | | |
|---|---|---|---|
| 5,668,036 A | 9/1997 | Sune | |
| 6,424,043 B1 * | 7/2002 | Lane et al. | ................. 257/754 |
| 6,593,242 B2 | 7/2003 | Morgenstern | |
| 6,664,585 B2 * | 12/2003 | Jin et al. | ..................... 257/311 |
| 6,696,368 B2 * | 2/2004 | Derraa et al. | ................ 438/761 |
| 6,708,405 B2 * | 3/2004 | Hasler et al. | .................. 29/852 |
| 6,734,486 B2 * | 5/2004 | Okumura | ..................... 257/303 |
| 6,825,545 B2 | 11/2004 | Nasr | |
| 6,838,722 B2 | 1/2005 | Bhalla et al. | |
| 6,984,568 B2 * | 1/2006 | Jin et al. | ..................... 438/386 |
| 2001/0048125 A1 * | 12/2001 | Okumura | ..................... 257/296 |
| 2002/0064600 A1 | 5/2002 | Gebhart et al. | |
| 2003/0141525 A1 | 7/2003 | Nowak | |
| 2005/0110079 A1 | 5/2005 | Nowak | |

* cited by examiner

*Primary Examiner*—Michael Lebentritt
*Assistant Examiner*—Stanetta Isaac
(74) *Attorney, Agent, or Firm*—Gibb & Rahman, LLC; Ira D. Blecker, Esq.

(57) ABSTRACT

Embodiments herein present a method for forming a poly filled substrate contact on a SOI structure. The method forms an insulator on a substrate and forms a substrate contact hole within the insulator. The insulator surface level is higher than final structure. Next, a poly overfill is performed, comprising filling the substrate contact hole with polysilicon and covering the insulator with the polysilicon. Specifically, the thickness of the polysilicon is greater than the size of the substrate contact hole. Following this, the polysilicon is etched, wherein a portion of the polysilicon is removed, and wherein the substrate contact hole is left partially filled with the polysilicon. Further, the etching of the polysilicon forms a concave recess within a top portion of the polysilicon. The etching of said polysilicon does not contact the substrate. The excess of insulator is polished off to the desired level.

18 Claims, 8 Drawing Sheets

POLY FILLED SUBSTRATE CONTACT ON SOI STRUCTURE

BACKGROUND OF THE INVENTION

1. Field of the Invention

Embodiments herein present a method for forming a poly filled substrate contact on a SOI structure.

2. Description of the Related Art

Unlike bulk silicon technology, silicon on insulator (SOI) technology requires substrate contact through buried oxide (BOX), which can result in additional process steps. Poly fill and chemical mechanical polishing (CMP) are typical methods for forming a body contact. However, the CMP process is a costly process that can cause polishing scratches, which results in poor yield.

More specifically, FIGS. 1(a) to 1(e) illustrate a conventional process for forming a substrate contact on a SOI structure. The process begins by performing a shallow trench isolation (STI) process, comprising oxide filling and oxide CMP (FIG. 1(a)). Additionally, the STI process includes pad oxide and pad nitride formation, as well as active area patterning. Next, a substrate contact hole is made through STI oxide and BOX with litho/dry etching (FIG. 1(b)). Polysilicon is then formed over the structure with a low pressure chemical vapor deposition (LPCVD) process (FIG. 1(c)). Following this, the polysilicon is polished via CMP (FIG. 1(d)). As described above, the CMP process is a costly process that can cause polishing scratches, which results in poor yield. Finally, a shallow polysilicon recess is formed to a desired level with a dry etching method (FIG. 1(e)).

SUMMARY OF THE INVENTION

Embodiments herein present a method for forming a poly filled substrate contact on a SOI structure. The method forms an insulator on a substrate and forms a substrate contact hole within the insulator. Next, a poly overfill is performed, comprising filling the substrate contact hole with polysilicon and covering the insulator with the polysilicon.

Specifically, the thickness of the polysilicon is greater than the size of the substrate contact hole. Following this, the polysilicon is etched, wherein a portion of the polysilicon is removed, and wherein the substrate contact hole is left partially filled with the polysilicon.

Further, the etching of the polysilicon forms a concave recess within a top portion of the polysilicon. The etching of the polysilicon does not contact the substrate. In other words, the etching of the polysilicon removes a part of filled polysilicon only and the substrate is in intact.

Subsequently, ions are implanted into the substrate contact hole partially filled with the polysilicon and, after implanting the ions, the insulator is polished to remove a portion of the insulator. As such, the polishing of the insulator is conducted subsequent to the performing of the poly overfill and the etching of the polysilicon.

Accordingly, embodiments herein present a method for forming a poly filled substrate contact on a SOI structure. More specifically, a chemical mechanical polishing (CMP) process is eliminated by a poly overfill and an etch back process. In addition, the substrate contact formation is done before a shallow trench isolation (STI) CMP process to minimize the impact on STI step height variation. Deep ion implantation is possible as well due to the new process sequences as well, providing lower poly resistance as one of advantages.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1A:
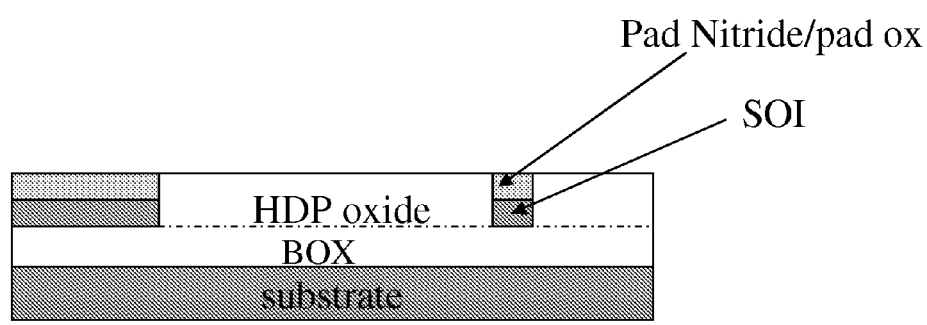
FIG. 1(a) is a diagram illustrating a final structure of STI process on SOI structure.
Figure 1B:
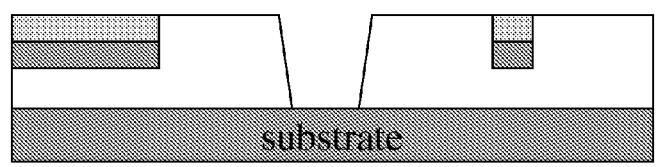
FIG. 1(b) is a diagram illustrating a substrate contact hole formation step.
Figure 1C:
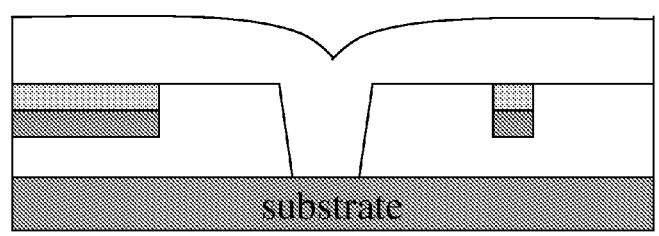
FIG. 1(c) is a diagram illustrating a poly fill step.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Accordingly, embodiments herein present a method for forming a poly filled substrate contact on a SOI structure.

More specifically, a chemical mechanical polishing (CMP) process is eliminated by a poly overfill and an etch back process. In addition, the substrate contact formation is done before a shallow trench isolation (STI) CMP process. Any RIE damage possibly caused by the etch back process is on the insulator surface only, which is removed during STI CMP process, resulting in no harmful impact on final STI structure. Relatively higher ion implantation into polysilicon is possible without mask for lower resistance due to extra insulator above pad nitride.

Figure 2A:
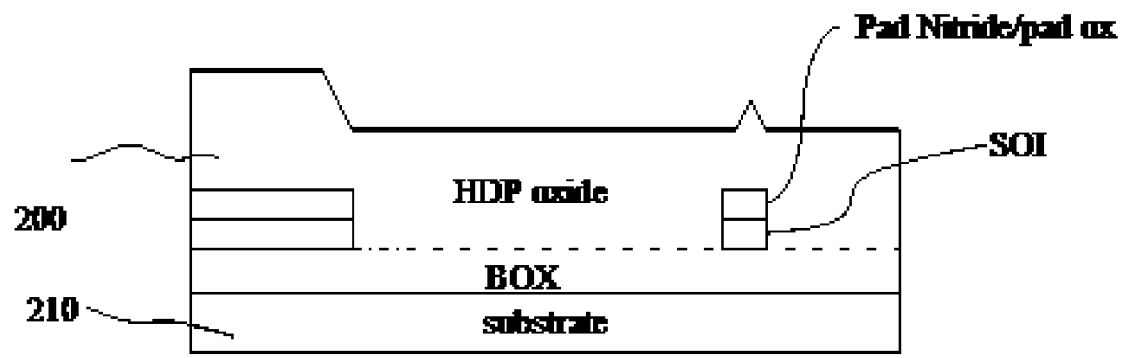
FIG. 2(a) is a diagram illustrating HDP oxide fill for STI on SOI structure.

More specifically, referring out to the drawings, FIGS. 2(a)-2(e) illustrate one embodiment of the invention. In FIG. 2(a), a STI trench is formed and high density plasma (HDP) oxide (i.e., the insulator) 200 is filled on a substrate 210. Additionally, this process includes pad oxide and pad nitride formation, as well as active area patterning. As described above, these processes are commonly known within the art.

Figure 2B:
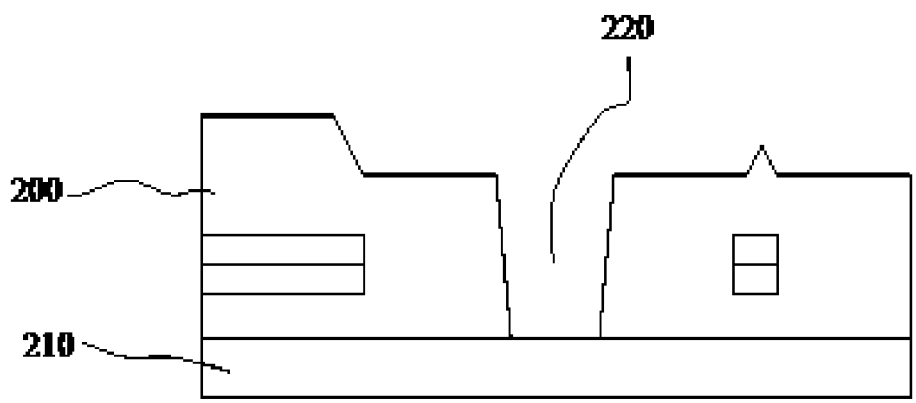
FIG. 2(b) is a diagram illustrating a substrate contact hole formation step.
Figure 2C:
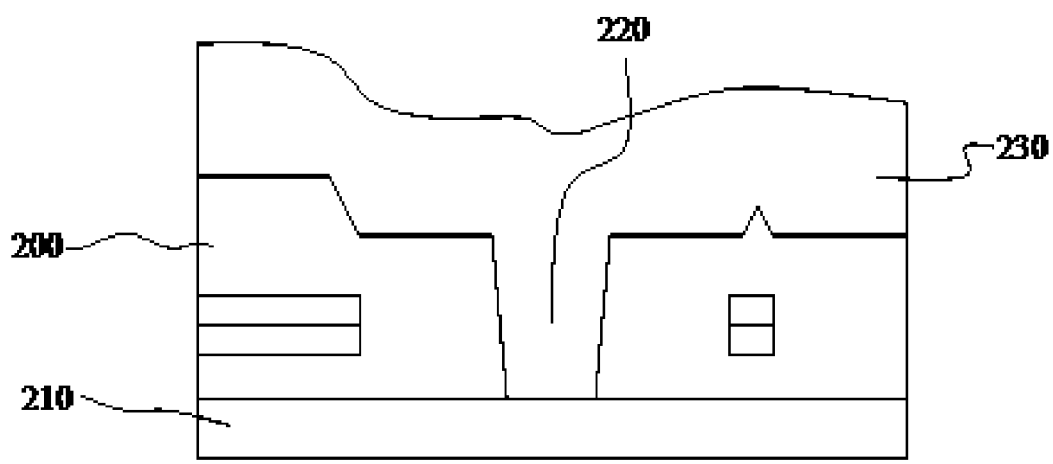
FIG. 2(c) is a diagram illustrating a poly overfill step.

Following this, a substrate contact hole 220 is formed with litho/dry etching (FIG. 2(b)), wherein the substrate contact hole 220 is subsequently filled with polysilicon 230 (i.e., the poly overfill (FIG. 2(c))). To ensure that the substrate contact hole 220 is completely filled, the poly overfill results in excess polysilicon 230 that covers the surface of the substrate. Moreover, because the polysilicon 230 is conformal, the underlying topography of the substrate is reflected in the polysilicon 230 layer. Thus, the surface of the polysilicon 230 layer includes a depression over the substrate contact hole 220.

Figure 3:
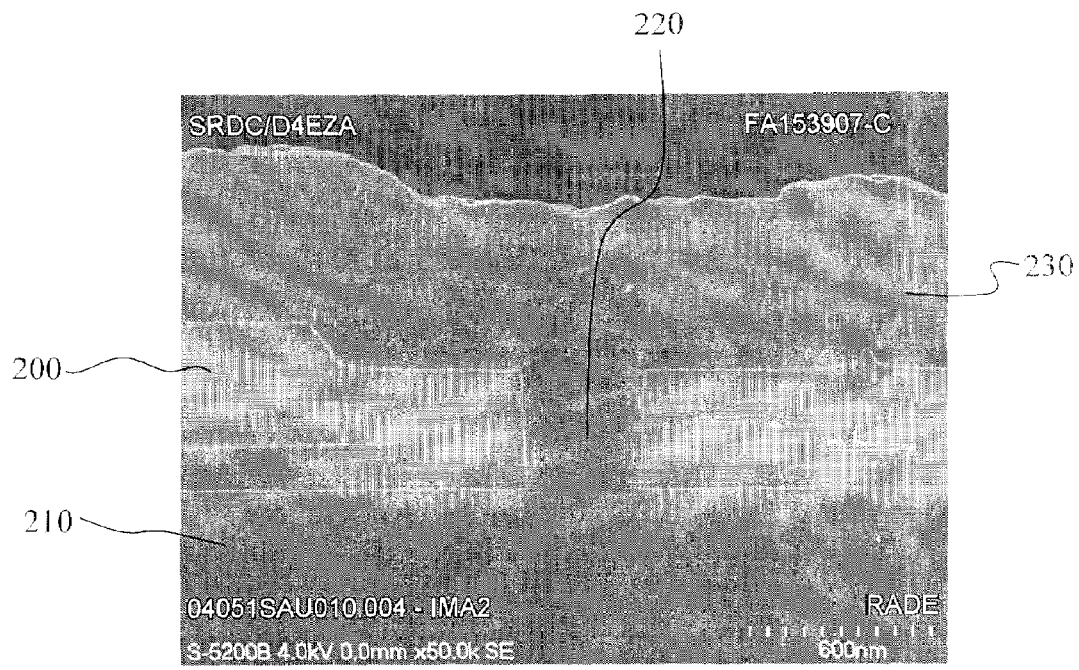
FIG. 3 is a SEM image illustrating the product of the step in FIG. 2(c)

FIG. 3 illustrates a scanning electron microscopy (SEM) cross section of the poly overfill, which demonstrates that the polysilicon 230 can nearly planarize the substrate contact hole 220 by adjusting the polysilicon 230 thickness. In FIG. 3, 6000 A of polysilicon 230 is filled in the substrate contact hole 220 having a size of about 0.5 um. Accordingly, by limiting the size of the substrate contact hole 220 to about below the thickness of the polysilicon 230, a polysilicon CMP process can be eliminated. For example, if the thickness of the polysilicon 230 is 0.6 um, then the size of the substrate contact hole 220 must be ~<0.6 um.

Figure 1D:
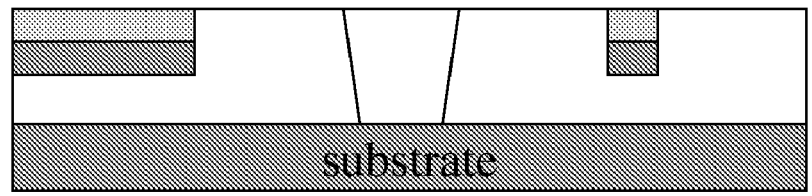
FIG. 1(d) is a diagram illustrating a polishing step.
Figure 1E:
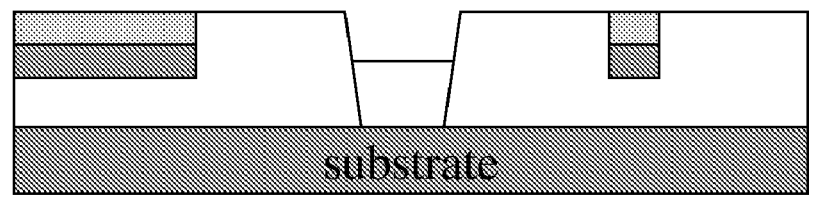
FIG. 1(e) is a diagram illustrating a poly recess step.
Figure 2D:
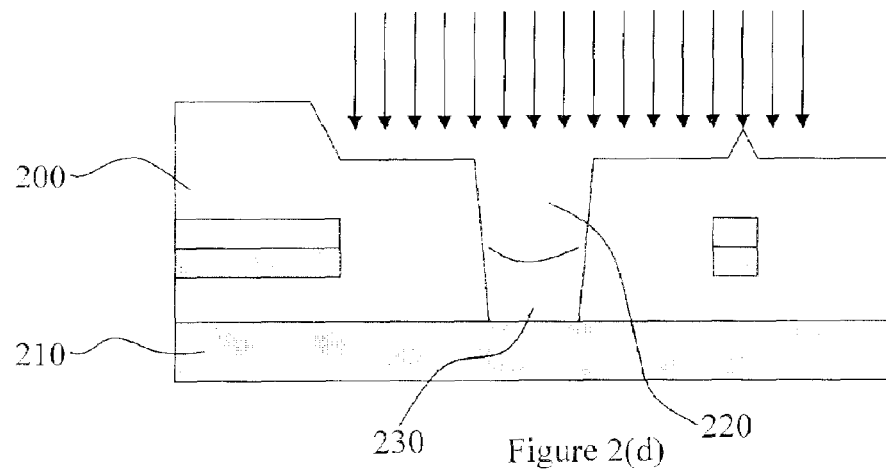
FIG. 2(d) is a diagram illustrating poly silicon etch back and ion implantation steps.
Figure 4:
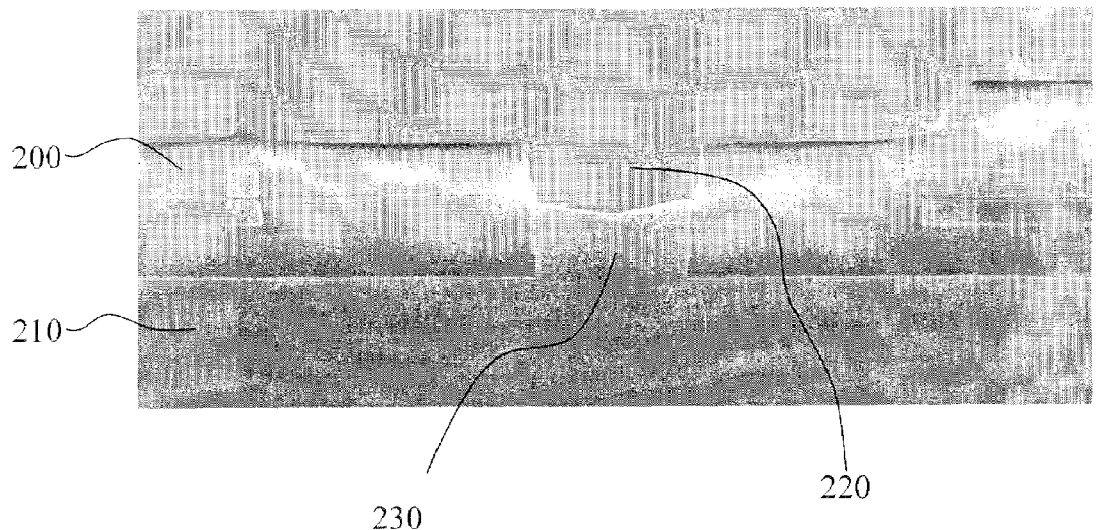
FIG. 4 is a SEM image illustrating the product of the step in FIG. 2(d)

Next, as illustrated in FIG. 2(d), a polysilicon etch back is conducted with an isotropical dry etch. Moreover, as illustrated in FIG. 4, the poly overfill and the polysilicon etch back eliminates two additional process steps: (1) a polysilicon CMP (FIGS. 1(d)); and, a subsequent polysilicon etch back (FIG. 1(e)).

Referring back to FIG. 2(d), ion implantation can be performed following the polysilicon etch back. The ion implantation does not require additional lithography since the HDP oxide 200 at the surface with ion implanted is removed during subsequent process (CMP). The implantation energy needs to be adjusted so that the ions do not go into the critical region (below the nitride surface). The HDP oxide 200 thickness above the nitride surface is thick enough so that ions can be implanted into the filled polysilicon 230 to reduce resistance.

Figure 2E:
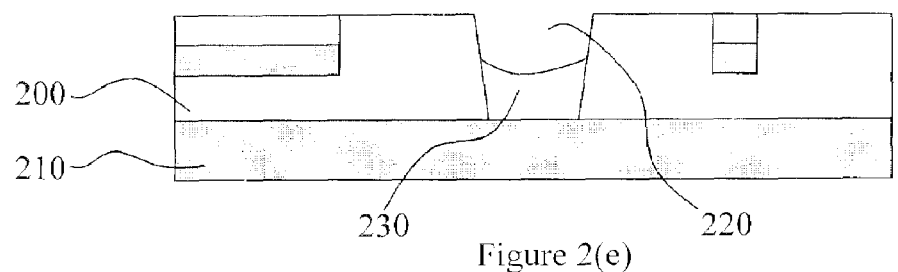
FIG. 2(e) is a diagram illustrating a STI insulator polishing step.
Figure 2F:
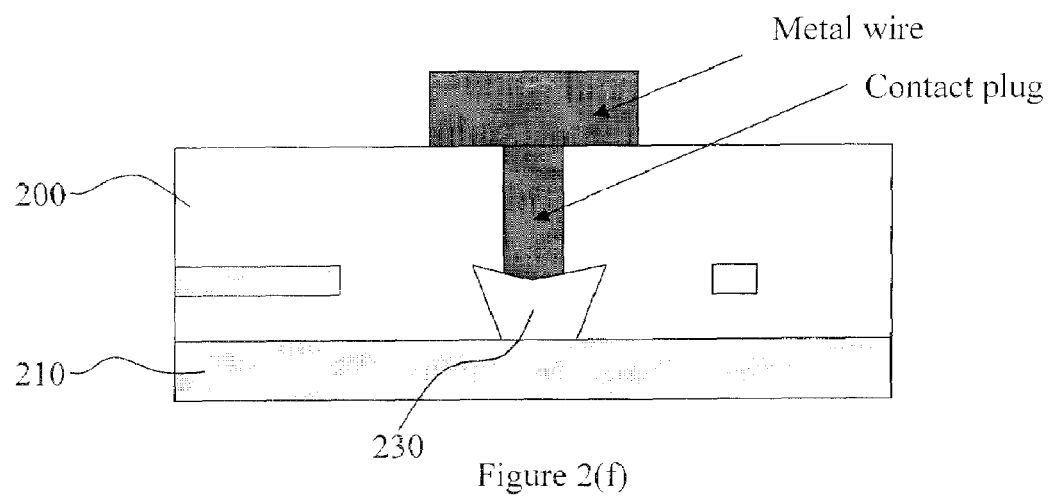
FIG. 2(f) is a diagram illustrating a final structure of substrate contact followed by typical MOS process.
Figure 5:
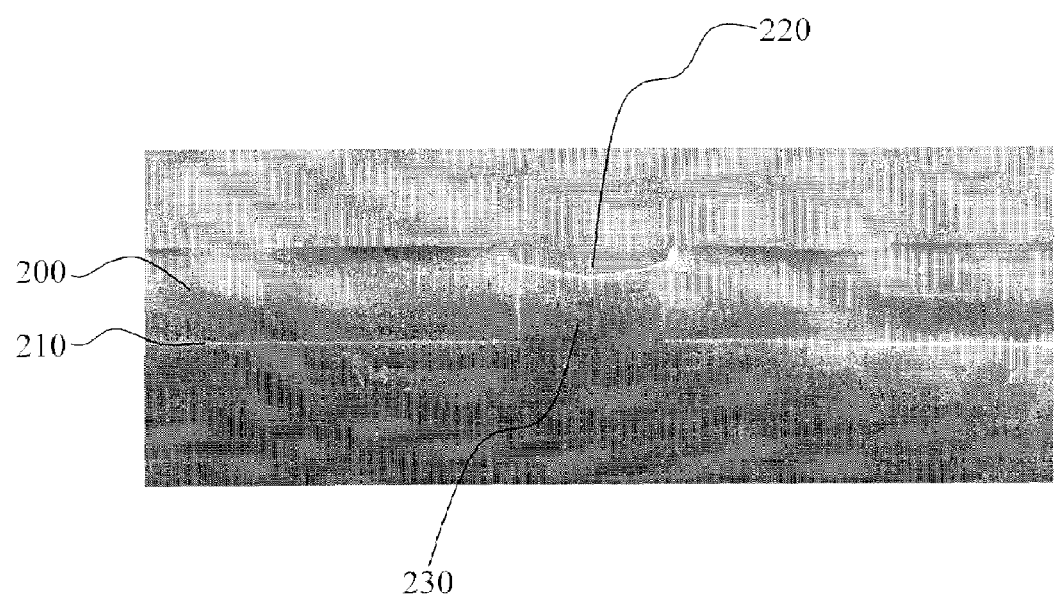
FIG. 5 is a SEM image illustrating the product of the step in FIG. 2(e)
Figure 6:
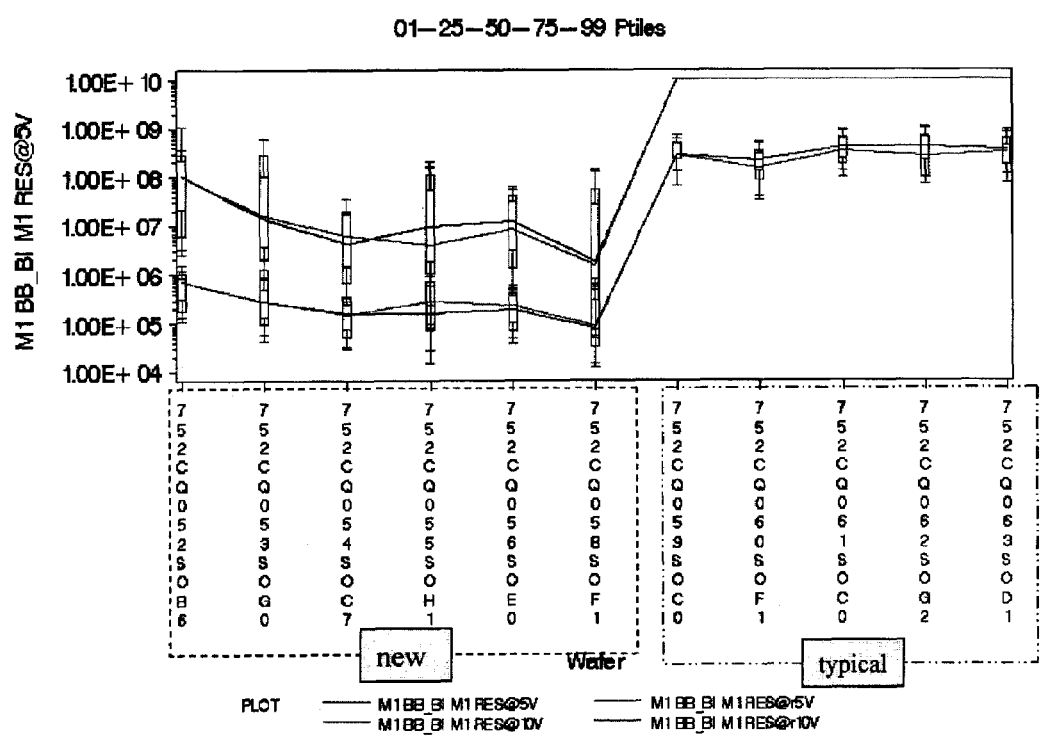
FIG. 6 is a graph illustrating a contact resistance comparison.

Following this, as illustrated in FIGS. 2(e) and 5, oxide CMP is performed. Specifically, the polysilicon 230 is recessed below the oxide CMP and the oxide corner shape is preserved. The final structure is illustrated in FIG. 2(f) (the details of the transistors are not shown). In FIG. 6, a graph illustrates a contact resistance comparison between embodiments of the invention and typical methods. Embodiments herein show better contact properties (lower contact resistance).

Thus, embodiments herein present a method for forming a poly filled substrate contact on a SOI structure. The method forms an insulator 200 (i.e., the HDP oxide) on a substrate 210. As discussed above, this process includes pad oxide and pad nitride formation, as well as active area patterning and STI oxide fill. Further, the forming of the insulator 200 comprises forming oxide on the substrate 210. Next, a substrate contact hole 220 is formed within the insulator 200 with litho/dry etching. In particular, a step between surface of the insulator 200 and recessed poly fill (which will be explained later) is maximized by making the contact before STI Oxide CMP. Its advantage will be explained below.

The method then performs a poly overfill, comprising filling the substrate contact hole 220 with polysilicon 230 and covering the insulator 200 with the polysilicon 230. Specifically, the thickness of the polysilicon 230 is greater than the size of the substrate contact hole 220. As discussed above, because the polysilicon 230 is conformal, the underlying topography of the substrate is reflected in the polysilicon 230 layer. Thus, the surface of the polysilicon 230 layer includes a depression over the substrate contact hole 220. However, amount of the depression can be reduced by increasing thickness of filled polysilicon as shown and the contact hole is almost planarized.

Following this, an isotropical dry etch of the polysilicon 230 is performed, wherein a portion of the polysilicon 230 is removed, and wherein the substrate contact hole 220 is left partially filled with the polysilicon 230. Since the polysilicon covers oxide surface except contact trenches, end point control is easy during the poly silicon etch back due to material difference. Isotropical and anisotropical component can be combined depending on the degree of STI oxide fill topography which is related with STI depth and STI oxide fill process. Embodiments of the invention are not limited to isotropical poly etch back only. Thus, as discussed above, the poly overfill and the polysilicon etch back eliminates a polysilicon CMP (FIGS. 1(d)) and a subsequent polysilicon etch back (FIG. 1(e)). The performing of the poly overfill and the etching of the polysilicon 230 also avoids a silicon substrate etching process (i.e., does not include any silicon substrate removal). Moreover, the etching of the polysilicon 230 forms a concave recess (trace amount only due to thicker poly fill) within a top portion of the polysilicon 230 left within the substrate contact hole 220. The etching of the polysilicon 230 does not contact the substrate 210. In other words, the etching of the polysilicon 230 removes a part of the filled polysilicon only and does not remove any of the substrate 210.

Subsequently, ions can be implanted into the substrate contact hole 220 partially filled with the polysilicon 230 to reduce contact resistance. Ions can be same as substrate dopant type for ohmic contact. As discussed above, the ion implantation does not require additional lithography since the oxide at the surface (i.e., the insulator 200) with ion implanted is removed during subsequent process (CMP). This is another advantage by performing the substrate contact hole through the oxide surface which level is above final level as much as possible. The contact trench formation before STI oxide is one of concept of embodiments of the invention. The implantation energy needs to be adjusted so that the ions do not go into critical region (below the nitride surface).

After implanting the ions, the insulator 200 is polished to remove a portion of the insulator 200. As such, the polishing of the insulator 200 is conducted subsequent to the performing of the poly overfill and the etching of the polysilicon. As discussed above, the polysilicon 230 is recessed below the oxide CMP and the oxide corner shape can be preserved.

Figure 7:
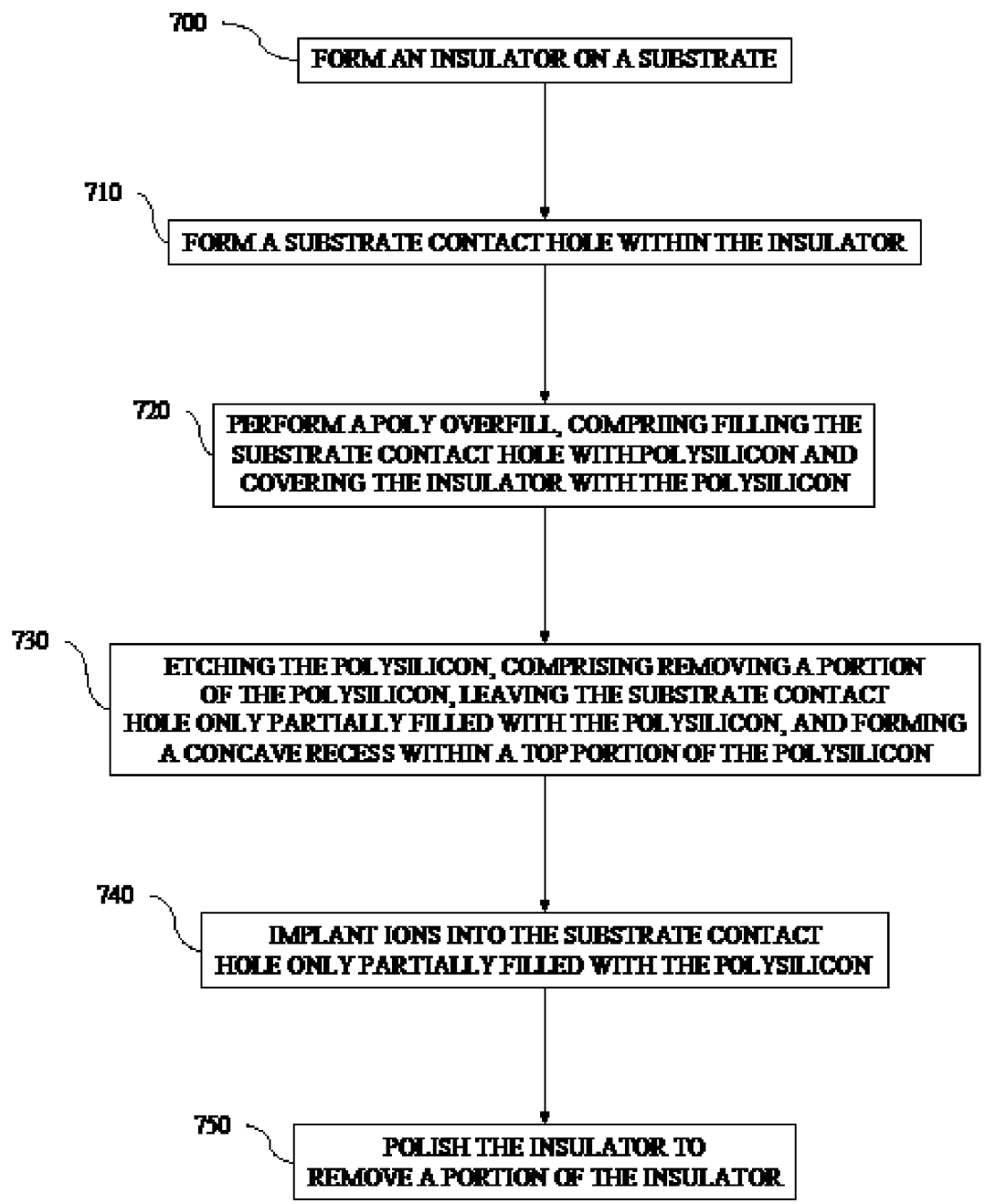
FIG. 7 is a flow diagram illustrating a method of the invention.

FIG. 7 illustrates a flow diagram of a method for forming a silicon on insulator structure. In item 700, the method begins by forming an insulator on a substrate. As described above, this process includes pad oxide and pad nitride formation, active area patterning, and forming oxide on the substrate. Next, in item 710, a substrate contact hole is formed within the insulator with litho/dry etching. Specifically, the substrate contact hole has a size that is less than a thickness of the polysilicon.

Following this, in item 720, a poly overfill is performed, comprising filling the substrate contact hole with polysilicon and covering the insulator with the polysilicon. As discussed above, the polysilicon can nearly planarize the substrate contact hole by adjusting the polysilicon thickness. In FIG. 3, 6000 A of polysilicon is filled in the substrate contact hole having a size of about 0.5 nm.

The method then etches the polysilicon, in item 730, comprising removing a portion of the polysilicon, leaving the substrate contact hole partially filled with the polysilicon, and forming a concave recess within a top portion of the polysilicon. Specifically, the polysilicon is situated within the substrate contact hole and over the insulator prior to the performing of the poly overfill, wherein the substrate contact hole is partially filled with the polysilicon subsequent to the etching of the polysilicon, and wherein the performing of the poly overfill and the etching of the polysilicon is a continuous process. Thus, as discussed above, the poly overfill and the polysilicon etch back eliminates a polysilicon CMP (FIGS. 1(d)) and a subsequent polysilicon etch back (FIG. 1(e)). The performing of the poly overfill and the etching of the polysilicon also does not need to etch any silicon substrate.

Subsequently, in item 740, ions are implanted into the substrate contact hole partially filled with the polysilicon. As discussed above, the HDP oxide thickness above nitride surface is thick enough so that ions can be implanted into the filled polysilicon to reduce resistance. Following this, in item 750, the insulator is polished to remove a portion of the insulator. Thus, the polishing of the insulator is conducted subsequent to the performing of the poly overfill and the etching of the polysilicon. Moreover, as discussed above, the polysilicon is recessed below the oxide CMP and the oxide corner shape is preserved.

Accordingly, embodiments herein present a method for forming a poly filled substrate contact on a SOI structure. More specifically, a chemical mechanical polishing (CMP) process is eliminated by a poly overfill and an etch back process. In addition, the substrate contact formation is done before a shallow trench isolation (STI) CMP process to minimize the impact on STI step height variation. Deep ion implantation is possible as well due to the new process sequences as well, providing lower poly resistance as one of advantages.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method for forming a silicon on insulator structure, comprising:
    forming an insulator on a substrate;
    forming a substrate contact hole within said insulator;
    performing a poly overfill, comprising filling said substrate contact hole with polysilicon and covering said insulator with said polysilicon;
    etching said polysilicon, comprising removing a portion of said polysilicon and leaving said substrate contact hole partially filled with said polysilicon; and
    implanting ions into said substrate contact hole partially filled with said polysilicon.

2. The method according to claim 1, wherein said forming said substrate contact hole comprises forming said substrate contact hole to have a size that is less than a thickness of said polysilicon.

3. The method according to claim 1, further comprising polishing said insulator to remove a portion of said insulator, wherein said polishing of said insulator is conducted subsequent to said performing of said poly overfill and subsequent to said etching of said polysilicon.

4. The method according to claim 1, wherein said etching of said polysilicon further comprises forming a concave recess within a top portion of said polysilicon.

5. The method according to claim 1, wherein said forming of said insulator comprises forming oxide on said substrate.

6. A method for forming a silicon on insulator structure, comprising:
    forming an insulator on a substrate;
    forming a substrate contact hole within said insulator;
    performing a poly overfill, comprising filling said substrate contact hole with polysilicon and covering said insulator with said polysilicon;
    etching said polysilicon, comprising removing a portion of said polysilicon and leaving said substrate contact hole partially filled with said polysilicon,
    wherein said etching of said polysilicon does not contact said substrate; and
    implanting ions into said substrate contact hole partially filled with said polysilicon.

7. The method according to claim 6, wherein said forming said substrate contact hole comprises forming said substrate contact hole to have a size that is less than a thickness of said polysilicon.

8. The method according to claim 6, further comprising polishing said insulator to remove a portion of said insulator, wherein said polishing of said insulator is conducted subsequent to said performing of said poly overfill and subsequent to said etching of said polysilicon.

9. The method according to claim 6, wherein said etching of said polysilicon further comprises forming a concave recess within a top portion of said polysilicon.

10. The method according to claim 6, wherein said forming of said insulator comprises forming oxide on said substrate.

11. A method for forming a silicon on insulator structure, comprising:
    forming an insulator on a substrate;
    forming a substrate contact hole within said insulator;
    performing a poly overfill, comprising filling said substrate contact hole with polysilicon and covering said insulator with said polysilicon;

etching said polysilicon, comprising removing a portion of said polysilicon and leaving said substrate contact hole partially filled with said polysilicon, implanting ions into said substrate contact hole partially filled with said polysilicon; and after implanting said ions, polishing said insulator to remove a portion of said insulator.

12. The method according to claim 11, wherein said forming said substrate contact hole comprises forming said substrate contact hole to have a size that is less than a thickness of said polysilicon.

13. The method according to claim 11, wherein said polishing of said insulator is conducted subsequent to said performing of said poly overfill and subsequent to said etching of said polysilicon.

14. The method according to claim 11, wherein said etching of said polysilicon further comprises forming a concave recess within a top portion of said polysilicon.

15. A method for forming a silicon on insulator structure, comprising:

forming an insulator on a substrate;

forming a substrate contact hole within said insulator;

performing a poly overfill, comprising filling said substrate contact hole with polysilicon and covering said insulator with said polysilicon;

etching said polysilicon, comprising removing a portion of said polysilicon and leaving said substrate contact hole partially filled with said polysilicon, wherein said etching of said polysilicon does not contact said substrate;

implanting ions into said substrate contact hole partially filled with said polysilicon; and after implanting said ions, polishing said insulator to remove a portion of said insulator.

16. The method according to claim 15, wherein said forming said substrate contact hole comprises forming said substrate contact hole to have a size that is less than a thickness of said polysilicon.

17. The method according to claim 15, wherein said polishing of said insulator is conducted subsequent to said performing of said poly overfill and subsequent to said etching of said polysilicon.

18. The method according to claim 15, wherein said etching of said polysilicon further comprises forming a concave recess within a top portion of said polysilicon.

* * * * *